United States Patent
Arambepola et al.

(10) Patent No.: US 8,036,319 B2
(45) Date of Patent: Oct. 11, 2011

(54) DIRECT CONVERSION RECEIVER AND METHOD FOR CORRECTING PHASE IMBALANCE THEREIN

(75) Inventors: Bernard Arambepola, Enfield Middlesex (GB); Nick Cowley, Wiltshire (GB)

(73) Assignee: Intel Corporation, Santa Clara, CA (US)

( * ) Notice: Subject to any disclaimer, the term of this patent is extended or adjusted under 35 U.S.C. 154(b) by 860 days.

(21) Appl. No.: 11/933,579

(22) Filed: Nov. 1, 2007

(65) Prior Publication Data

US 2009/0116586 A1  May 7, 2009

(51) Int. Cl.
 *H03D 3/22* (2006.01)
(52) U.S. Cl. ........ 375/329; 375/261; 375/268; 375/279; 375/308; 329/304; 455/205
(58) Field of Classification Search .................. 375/329, 375/261, 268, 279, 308; 329/304; 455/205
See application file for complete search history.

(56) References Cited

U.S. PATENT DOCUMENTS

| | | | | |
|---|---|---|---|---|
| 5,263,196 A * | 11/1993 | Jasper | ............................. | 455/324 |
| 7,010,278 B2 * | 3/2006 | Kirschenmann et al. | .. | 455/114.2 |
| 7,061,994 B2 * | 6/2006 | Li et al. | ........................ | 375/316 |
| 7,130,359 B2 * | 10/2006 | Rahman | ......................... | 375/316 |
| 7,133,657 B2 * | 11/2006 | Kuenen et al. | ................ | 455/324 |
| 7,251,291 B1 * | 7/2007 | Dubuc et al. | .................. | 375/296 |
| 7,310,388 B2 * | 12/2007 | Koskela et al. | ............... | 375/329 |
| 7,649,934 B2 * | 1/2010 | Su | ................................ | 375/235 |
| 2002/0097812 A1 * | 7/2002 | Wiss | .............................. | 375/316 |
| 2003/0012305 A1 * | 1/2003 | Auranen | ....................... | 375/316 |
| 2003/0031273 A1 * | 2/2003 | Mohindra | ..................... | 375/324 |
| 2003/0053563 A1 * | 3/2003 | Mohindra | ..................... | 375/324 |
| 2004/0082300 A1 * | 4/2004 | Scheck | ......................... | 455/126 |
| 2004/0156450 A1 * | 8/2004 | Auranen et al. | .............. | 375/324 |
| 2004/0203472 A1 * | 10/2004 | Chien | ............................ | 455/68 |
| 2005/0036572 A1 * | 2/2005 | Muhammad et al. | ......... | 375/322 |
| 2005/0227642 A1 * | 10/2005 | Jensen | ....................... | 455/127.1 |
| 2007/0263667 A1 * | 11/2007 | Dubuc et al. | .................. | 370/500 |
| 2008/0025381 A1 * | 1/2008 | Lee et al. | ...................... | 375/219 |
| 2008/0056397 A1 * | 3/2008 | Li et al. | ........................ | 375/260 |

OTHER PUBLICATIONS

Nakagawa, "A 45-degree CMOS Phase Shifter and GaidPhase Imbalance Compensation for Multi-Band Transceivers" IEEE Rafio frequency Integrated circuit symposium, 2005.*
Direct Conversion Receiver for DVB-H, IEEE Journal of Soli State Circuits, vol. 40, No. 12, Dec. 2005.

* cited by examiner

*Primary Examiner* — Juan A Torres
(74) *Attorney, Agent, or Firm* — Grossman, Tucker, Perreault & Pfleger, PLLC

(57) ABSTRACT

A direct conversion receiver and a method for correcting phase imbalance including applying an input signal to an in-phase channel and a quadrature channel of the receiver. The input signal is processed by the receiver to obtain an in-phase zero intermediate frequency (IF) signal in the in-phase channel and a quadrature zero-IF signal in the quadrature channel. The in-phase zero-IF signal and the quadrature zero-IF signal are filtered to obtain a fixed band signal. A phase imbalance correction value is obtained for the fixed-band quadrature zero-IF signal as a function of the frequency of the fixed-band in-phase zero-IF signal and the fixed-band quadrature zero-IF signal. The in-phase zero-IF signal and the quadrature zero-IF signal are sampled and the phase imbalance correction value is applied using an interpolation to the sampled quadrature zero-IF signal or to the sampled in-phase zero-IF signal to correct the phase imbalance in the direct conversion receiver.

2 Claims, 4 Drawing Sheets

DIRECT CONVERSION RECEIVER AND METHOD FOR CORRECTING PHASE IMBALANCE THEREIN

FIELD OF THE DISCLOSURE

The present disclosure generally relates to radio receivers, and more particularly to direct conversion receivers and a method for correcting phase imbalance in the direct conversion receiver.

BRIEF DESCRIPTION OF THE DRAWINGS

The advantages and features of the present disclosure will become better understood with reference to the following detailed description and claims taken in conjunction with the accompanying drawings, wherein like elements are identified with like symbols, and in which:

DETAILED DESCRIPTION OF THE DISCLOSURE

For a thorough understanding of the present disclosure, reference has to be made to the following detailed description, including the appended claims, in connection with the above-described drawings. Although the present disclosure is described in connection with exemplary embodiments, the present disclosure is not intended to be limited to the specific forms set forth herein. It is understood that various omissions and substitutions of equivalents are contemplated as circumstances may suggest or render expedient, but these are intended to cover the application or implementation without departing from the spirit or scope of the claims of the present disclosure. Also, it is to be understood that the phraseology and terminology used herein is for the purpose of description and should not be regarded as limiting.

The terms "a" and "an" herein do not denote a limitation of quantity, but rather denote the presence of at least one of the referenced item.

Figure 1:
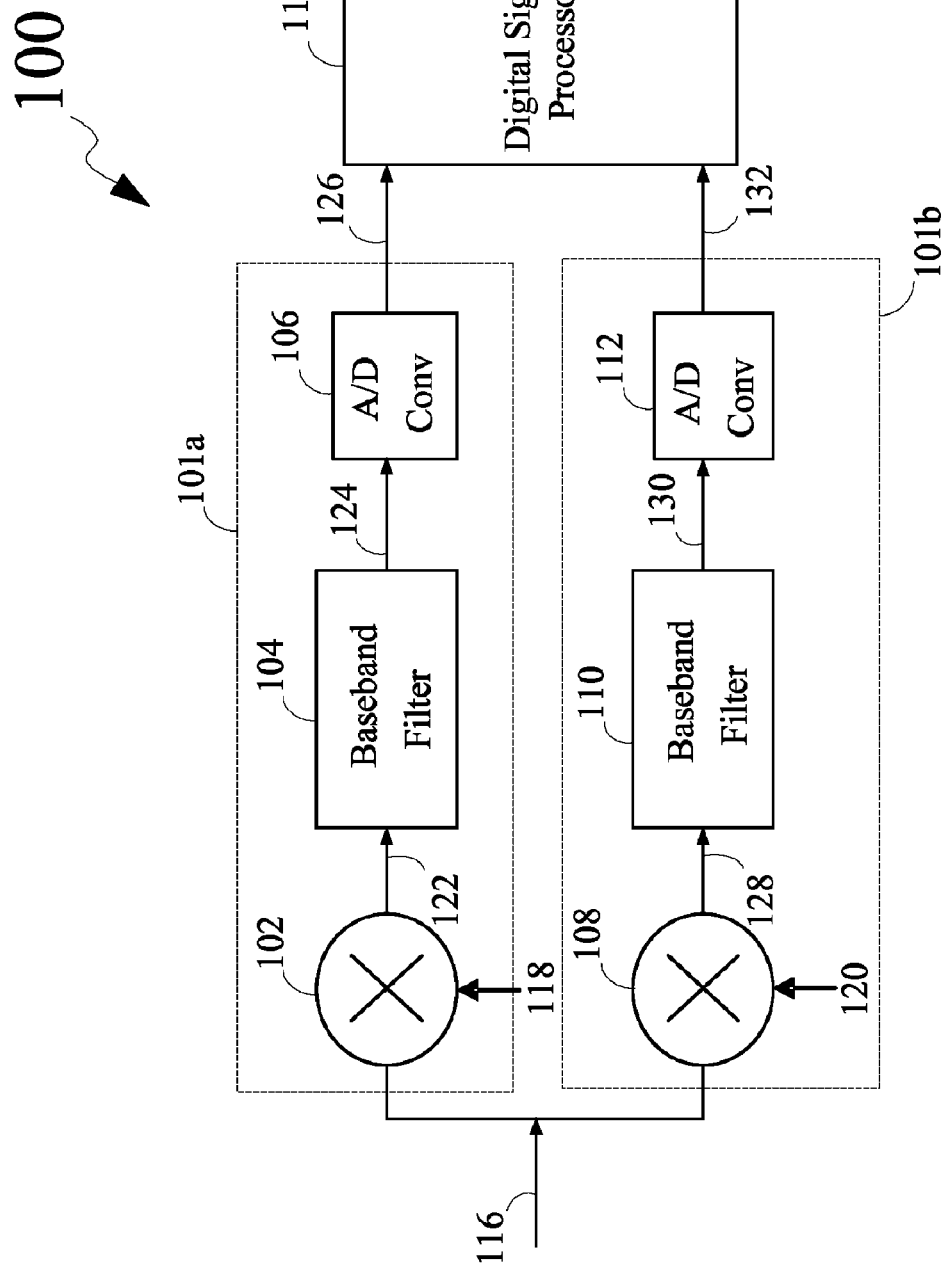
FIG. 1 is a schematic diagram illustrating a prior art direct-conversion receiver.

FIG. 1 is a circuit diagram illustrating a prior art direct conversion receiver 100 (hereinafter referred to as "receiver 100"). Preferably, the receiver 100 may be a Zero-Intermediate Frequency (IF) receiver. The receiver 100 receives an input signal 116, as shown in FIG. 1. The input signal 116 may comprise signals, which include, but are not limited to, digital Television (TV) signals such as signals pertaining to satellite TV, terrestrial TV, mobile TV and cable TV. The receiver 100 comprises two channels, namely an in-phase channel 101a and a quadrature channel 101b. The in-phase channel 101a comprises a mixer 102, a baseband filter 104 connected to the mixer 102 and an Analog-to-Digital converter (ADC) 106 connected to the baseband filter 104. The quadrature channel 101b comprises a mixer 108, a baseband filter 110 connected to the mixer 108 and an ADC 112 connected to the baseband filter 110. The receiver 100 further comprises a Digital Signal Processor (DSP) 114 connected to the ADC 106 of the in-phase channel 101a and the ADC 112 of the quadrature channel 101b.

The mixer 102 of the in-phase channel 101a receives the input signal 116 and mixes the input signal 116 with a local oscillator (LO) frequency 118. The LO frequency 118 is preferably at about the same frequency as a carrier frequency of the input signal 116. Further, the LO frequency 118 has a same phase as the input signal 116. As a result of mixing, a signal 122 is obtained at an output of the mixer 102, which is at a baseband frequency of the input signal 116. The baseband filter 104 receives the signal 122 from the mixer 102 and filters the signal 122 to obtain a signal 124. More specifically, the method of filtering may comprise filtering noise components in the signal 122, or extracting various signal components of the signal 122 centered at frequencies other than the baseband frequency. The ADC 106 receives the signal 124 from the baseband filter 104 and converts the signal 124 to a sampled signal 126.

The quadrature channel 101b is similar in design to the in-phase channel 101a. The mixer 108 mixes the input signal 116 with an LO frequency 120 to obtain a signal 128. The LO frequency 120 is preferably at about the same frequency as a carrier frequency of the input signal 116 but shifted in phase by 90 degree angle with respect to the input signal 116. As a result of mixing, the signal 128 is obtained at a baseband frequency in the input signal 116. Further, the baseband filter 110 receives the signal 128 from the mixer 108. The signal 128 is filtered by the baseband filter 110 to obtain a signal 130. The signal 130 is applied to the ADC 112, which converts the signal 130 to a sampled signal 132.

The DSP 114 of the receiver 100 receives the sampled signal 126 and the sampled signal 132 from the in-phase channel 101a and quadrature channel 101b respectively. The sampled signal 126 and the sampled signal 132 are processed by the DSP 114 to obtain information present in the input signal 116.

The receiver 100 is a simple circuit with limited number of components and therefore it is effective in terms of cost factor and space requirement. Further, the receiver 100 has a simplified filter design since the signals 122 and 128 at the outputs of the mixers 102 and 108 respectively of the receiver 100 are at baseband frequency. However, the receiver 100 has an inherent phase imbalance and gain imbalance between the in-phase channel 101a and the quadrature channel 101b. Methods for correcting the gain imbalance are already known in the art. For example, the gain imbalance between the in-phase channel 101a and the quadrature channel 101b may be corrected by using an Automatic Gain Control (AGC) circuit. The AGC circuit may be preferably disposed between the baseband filter and the ADC of each of the in-phase channel 101a and the quadrature channel 101b to correct the gain imbalance. However, there exists a need for a method for correcting the phase imbalance between the in-phase channel 101a and the quadrature channel 101b of the receiver 100.

The present disclosure describes a method for correcting a phase imbalance between the in-phase channel and the quadrature channel of a direct conversion receiver. Also, a direct conversion receiver implementing such a method is described.

The present disclosure models the phase imbalance based on the following description. In a typical zero-IF receiver, the phase imbalance between an in-phase channel and a quadrature channel is a function of frequency and may be expressed in terms of a power series as equation (1):

$$\Delta\Phi(f) = \Delta\Phi_o + \Delta\Phi_1(f-fo) + \Delta\Phi_2(f-fo)^2 + \quad (1)$$

where $\Delta\Phi(f)$ is an overall phase imbalance between the in-phase channel and the quadrature channel of the zero-IF receiver and fo is a carrier frequency of an input signal at the mixers of the zero-IF receiver. Terms $\Delta\Phi_1$ and $\Delta\Phi_2$ represent coefficients of the power series in equation (1).

Practically, it has been observed that the phase imbalance can be approximated by considering only the first two terms of the power series of equation (1). Further, in accordance with an exemplary embodiment of the present disclosure, the component $\Delta\Phi_1$fo may be ignored from equation (1) based on the assumption that that the zero-IF receiver has converted the input signal to a baseband signal. Accordingly, the phase imbalance of equation (1) may be represented as equation (2) below:

$$\Delta\Phi(f) = \Delta\Phi_o + \Delta\Phi_1 f \quad (2)$$

Therefore, from equation (2) the phase imbalance $\Delta\Phi$ (f) comprises a frequency independent component $\Delta\Phi_o$ and a frequency dependent component $\Delta\Phi_1 f$. It will be apparent to a person skilled in the art that the frequency independent component ($\Delta\Phi_o$) may be balanced with the use of the efficient electronic circuits, which can work on balancing an offset of constant term $\Delta\Phi_o$. Therefore, the present disclosure provides a method of correction of the frequency dependent component ($\Delta\Phi_1 f$) of the phase imbalance $\Delta\Phi$.

Figure 2:
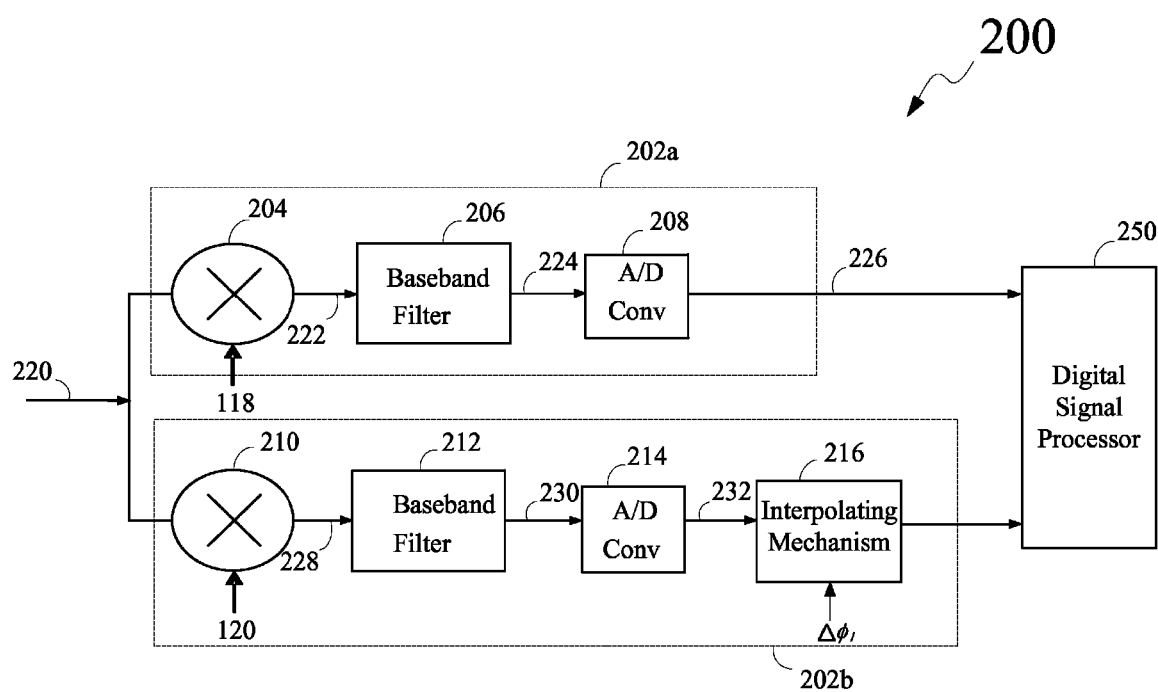
FIG. 2 is a schematic diagram illustrating a direct conversion receiver, according to an exemplary embodiment of the present disclosure.

FIG. 2 is a schematic diagram illustrating a direct conversion receiver 200 (hereinafter referred to as 'receiver 200'), according to an exemplary embodiment of the present disclosure. The receiver 200 comprises an in-phase channel 202a, a quadrature channel 202b and a DSP 250. The digital processor may be similar to DSP 114 of the receiver 100. The in-phase channel 202a comprises a mixer 204, a baseband filter 206 connected to the mixer 204 and an ADC 208 connected to the baseband filter 206. The quadrature channel 202b comprises a mixer 210, a baseband filter 212 connected to the mixer 210 and an ADC 214 connected to the baseband filter 212. The quadrature channel 202b further comprises an interpolating mechanism 216 connected to the ADC 214. The receiver 200 also comprises a phase estimation mechanism (not shown), which determines a phase imbalance correction value for the quadrature channel 202b.

In an embodiment of the present disclosure, the interpolating mechanism 216 may comprise an asymmetric Finite Impulse Response (FIR) filter such that tap coefficients of the asymmetric FIR filter are selected from a windowed sinc function. Further, the phase estimation mechanism of the receiver 200 may be implemented in software, hardware or as a combination of both software and hardware.

The operation of the in-phase channel 202a and the quadrature channel 202b of the receiver 200 is relatively similar to that of the receiver 100. More specifically, the in-phase channel 202a receives an input signal 220, which is converted to an in-phase zero-IF signal 222 by the mixer 204. A LO frequency, similar to LO frequency 118, is fed to the mixer 204 to obtain the in-phase zero-IF signal 222. Further, the in-phase zero-IF signal 222 is filtered by the baseband filter 206 to obtain a fixed band zero-IF signal 224 (hereinafter referred to as 'signal 224'). The signal 224 is sampled by the ADC 208 to obtain a sampled in-phase zero-IF signal 226 (hereinafter referred to as 'sampled signal 226').

Similarly, the quadrature channel 202b receives the input signal 220, which is converted to a quadrature zero-IF signal 228 by the mixer 210. The quadrature zero-IF signal 228 is filtered by the baseband filter 212 to obtain a fixed band zero-IF signal 230 (hereinafter referred to as 'signal 230'). The phase estimation mechanism determines a phase imbalance correction value for the signal 230. The interpolating mechanism 216 receives the phase imbalance correction value from the phase estimation mechanism Further, the ADC 214 samples the signal 230 to obtain a sampled quadrature zero-IF signal 232 (hereinafter referred to as 'sampled signal 232'). Thereafter, the interpolating mechanism 216 applies the phase imbalance correction value to the sampled signal 232 to correct the phase imbalance between the in-phase channel 202a and the quadrature channel 202b. The DSP 250 receives the corrected sampled signal 232 and the sampled signal 226 to further process the signals. The operation of the phase estimation mechanism and the interpolating mechanism 216 of the receiver 200 is further described in conjunction with FIG. 3.

Figure 3:
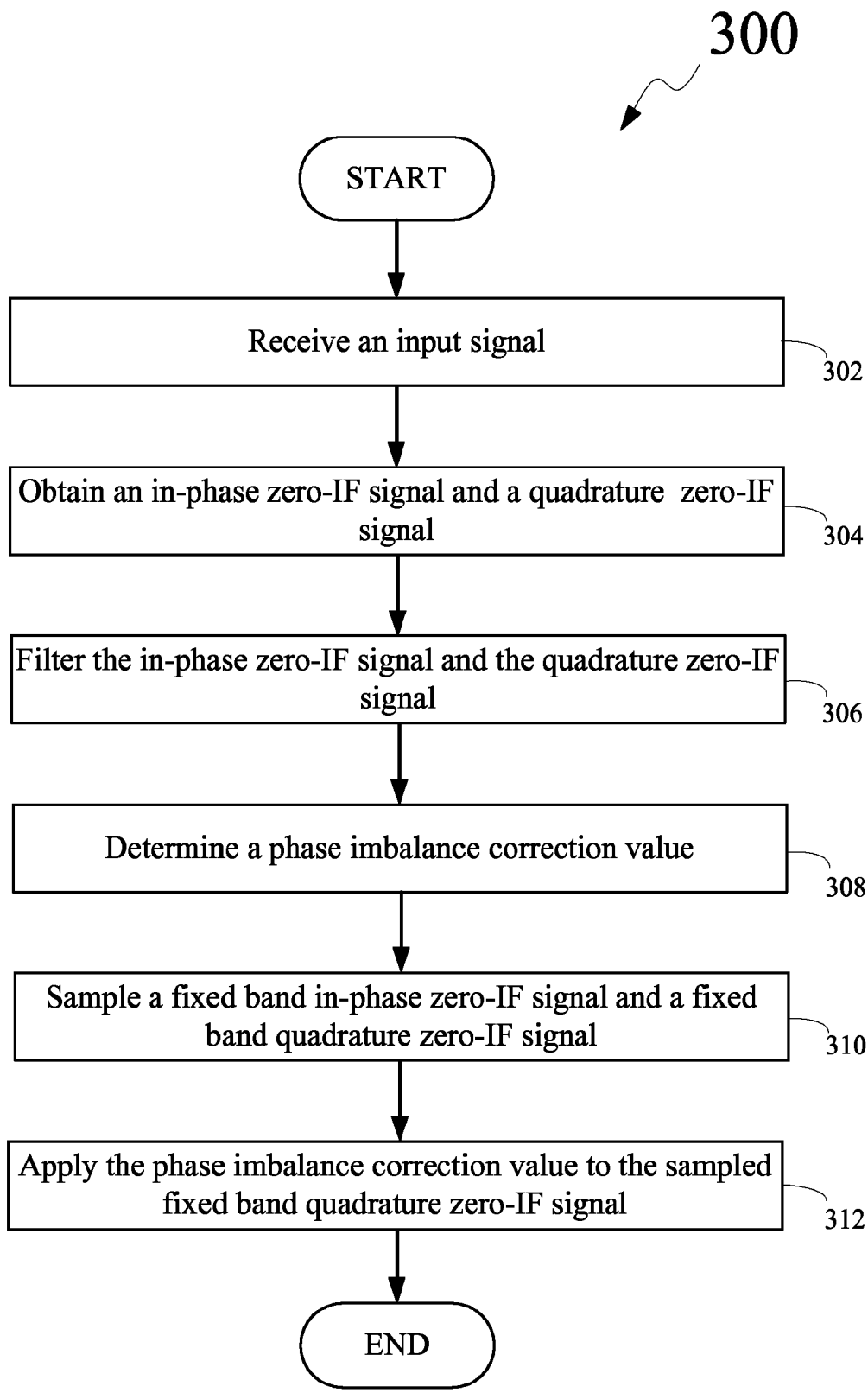
FIG. 3 is a flow diagram illustrating a method for correcting phase imbalance in the direct conversion receiver, according to an exemplary embodiment of the present disclosure.

FIG. 3 is a flow diagram 300 illustrating a method for correcting phase imbalance in the receiver 200. At 302, the method comprises receiving the input signal 220 to the in-phase channel 202a and the quadrature channel 202b of the receiver 200. The input signal 220 is received at the mixer 204 of the in-phase channel 202a and the mixer 210 of the quadrature channel 202b. Further, the input signal 220 may comprise a plurality of signal components, which will be described later in conjunction with description of various embodiments of the method for correcting phase imbalance in the receiver 200.

Further, at 304, the method comprises obtaining the in-phase zero-IF signal 222 in the in-phase channel 202a and the quadrature zero-IF signal 228 in the quadrature channel 202b. The in-phase zero-IF signal 222 and the quadrature zero-IF signal 228 are obtained as a result of baseband conversion of the input signal 220 by the mixers 204 and 210 respectively. It will be evident that the in-phase zero-IF signal 222 and the quadrature zero-IF signal 228 will have the plurality of signal components of the input signal 220.

At 306, the in-phase zero-IF signal 222 and the quadrature zero-IF signal 228 are filtered by using the baseband filters 206 and 212 respectively. The baseband filters 206 and 212 extract the plurality of signal components of the in-phase zero-IF signal 222 and the quadrature zero-IF signal 228. As a result of filtering, the signal 224 is obtained in the in-phase channel 202a and the signal 230 is obtained in the quadrature channel 202b.

At 308, the phase estimation mechanism of the receiver 200 estimates the phase imbalance correction value for the signal 232 by using the signal 226 and the signal 232. Although phase imbalance correction is estimated using the digitized signals for computational reasons, this imbalance correction value is also applicable to the analog version of the signal. The signal 224 and the signal 230 may be represented as a time-domain signal in the form of equation (3) as:

$$x_I(t) + j \, x_Q(t) \quad (3)$$

where $x_I(t)$ is the signal 224 in the in-phase channel 202a and $x_Q(t)$ is the signal 230 in the quadrature channel 202b. The signals $x_I(t)$ and $x_Q(t)$ are in the time-domain. Further, the effect of the frequency dependent phase imbalance ($\Delta\Phi_1 f$) on the signals in the time-domain may be understood by resolving the time-domain signal of equation (3) to a frequency-domain signal using Fourier Transform. Let the corresponding Fourier transform of component $x_I(t)$ and the component $x_Q(t)$ be an in-phase component $X_I(f)$ and a quadrature component $X_Q(f)$, respectively.

Referring back to equation (2), the effect of the frequency dependent phase imbalance component $\Delta\Phi_1 f$ can be incorporated in the frequency domain representation of the component $x_I(t)$ and the component $x_Q(t)$. The frequency dependent phase imbalance component ($\Delta\Phi_1 f$) affects the quadrature component $X_Q(f)$ such that the quadrature component $X_Q(f)$ is shifted in phase according to $\Delta\Phi_1 f$ component. As a result, a phase shifted signal $X_Q^1(f)$ is obtained from the quadrature component $X_Q(f)$, which may be represented as equation (4) below:

$$X_Q^1(f)=X_Q(f)\exp(j\Delta\Phi_1 f) \quad (4)$$

where $X_Q^1(f)$ is the phase-shifted quadrature component and $X_Q(f)$ is the quadrature component.

Equation (4) may be re-arranged to obtain a relation between the quadrature component $X_Q(f)$ and a phase shift in the quadrature component $X_Q(f)$ as equation (5) below:

$$X_Q(f)=X_Q^1(f)\exp(-j2\pi\tau f) \quad (5)$$

where $\tau$ is a correction value in the phase imbalance such that $\tau=-\Delta\Phi_1/2\pi$.

A corrected value of the signal 230 may be obtained in time domain by finding the inverse transform of equation (5). Therefore, performing the inverse transform on equation (5), the corrected value of the signal 230 is obtained as represented in equation (6) below:

$$x_Q(t)=x_Q^1(t-\tau) \quad (6)$$

In equation (6), $x_Q(t)$ represents the signal 230 in time domain and $x_Q^1(t-\tau)$ represents the corrected value of the signal 230. The phase imbalance correction value of the signal 230 is expressed in time domain as $(t-\tau)$. Therefore, equation (6) provides the corrected value of the signal 230 as well as the phase imbalance correction value for the signal 230.

To estimate the phase imbalance correction value, the phase estimation mechanism first estimates a phase imbalance value between the in-phase channel 202a and the quadrature channel 202b. The phase estimation mechanism determines the phase imbalance value for each signal component of the plurality of signal components of the input signal 220, which may be present in the signal 224 and the signal 230, and consequently in signal 226 and signal 232. The phase imbalance value is obtained as a function of the signal 226 and the signal 232 by using an equation (7) as below:

$$\text{Phase imbalance}=E(IQ)/E(I^2+Q^2) \quad (7)$$

In equation (7), expression $E(IQ)$ is the long term average of the product of the signal 226 and the signal 232. The expression $E(I^2+Q^2)$ is the long term average of the sum of square of the signal 226 and square of the signal 232. Once the phase imbalance value is obtained for each signal component of the plurality of signal components of the input signal 220, the phase estimation mechanism determines the phase imbalance correction value. The phase imbalance correction value is determined by finding a gradient with reference to frequency of the phase imbalance value for each signal component of the plurality of signal components obtained from equation (7). The gradient is obtained by using a least square fit technique.

Further, at 310, the method comprises sampling the signal 224 to obtain the sampled signal 226 and sampling the signal 230 to obtain the sampled signal 232. It will be obvious to a person skilled in the art that the sampling is carried out at a frequency high enough to prevent aliasing. In an embodiment of the present disclosure, the sampling frequency may be twice the frequency of the signal 224 or the signal 230. On sampling equation (6) with sampling interval T and taking n number of samples, the corrected zero-IF signal in a sampled domain may be expressed as $$x_Q(nT)=x_Q^1(nT-\tau) \quad (8)$$

Further, on carrying out normalized sampling of equation (8), the corrected zero-IF signal may be expressed as $$x_Q(n)=x_Q^1(n-\tau/T) \quad (9)$$

In equation (9), $\tau/T$ represents the phase imbalance correction value in the digital domain. Further, by referring to equation (9), it will be evident that the required correction in the signal 230 may be obtained by digital interpolation of the signal 232. Although the interpolation has been applied to the quadrature component 232, it may equally well be applied to the in-phase component 226, but with different interpolating coefficients.

Finally, at 312, the method comprises correcting the phase imbalance of the zero-IF signal 230. The interpolating mechanism 216 of the receiver 200 applies the phase imbalance correction value obtained from the estimation mechanism to the sampled signal 232. The phase imbalance correction value ($\tau/T$) is applied according to equation (9) to obtain the corrected value of the signal 230.

In practice, the value of $\tau/T$ is very small and therefore a short interpolator, such as an asymmetric FIR filter, may be utilized as the interpolating mechanism 216. The benefit of using the short interpolator is that low computational complexity may be achieved. Further, such an interpolator can be designed to maintain the interpolation noise below a thermal noise and a quantization noise of the receiver 200. As a result, the interpolation noise does not make any contribution in an overall Signal-to-Noise ratio of the receiver 200. In an embodiment of the present disclosure, an interpolator using Farrow structures based on power series may also be utilized as the interpolating mechanism 216. Therefore, by using the method as described above, the phase imbalance in the quadrature channel 202b may be corrected by using a relatively small number of hardware features such as the interpolating mechanism 216.

Further, the estimation of the phase imbalance correction value for the receiver 200 may be carried out by providing different types of input signal 220 to the receiver 200. The effects of using different input signals on the method for correcting the phase imbalance of the receiver 200 may be described in the following section.

In an embodiment of the method for correcting phase imbalance of the receiver 200 of the present disclosure, the input signal 220 may comprise an Orthogonal Frequency Division Multiplexing (OFDM) based RF signal having the plurality of signal components such as a plurality of pilot carriers. For example, the input signal 220 may be based on Digital Video Broadcasting having Terrestrial (DVB-T) standard or Handheld (DVB-H) standard, or Integrated Services Digital Broadcasting having Terrestrial (ISDB-T) standard. The frequencies of the pilot carriers in such input signal 220 are already known to the public. Therefore, the baseband filters 206 and 212 may be used to extract the pilot carriers in the in-phase channel 202a and the quadrature channel 202b, respectively. Alternatively, bandpass filters may be used to extract the pilot carriers in the digitized signals 226 and 232. Once the pilot carriers have been extracted, a phase imbalance value may be determined for each pilot carrier in the in-phase channel 202a and the quadrature channel 202b by using equation (7). Thereafter, the phase imbalance correction value may be obtained by finding a gradient of the phase imbalance values for the plurality of pilot carriers using a least square fit technique.

In another embodiment of the present disclosure, a method for correcting phase imbalance of the receiver 200 comprises receiving an input RF signal, similar to the input signal 220, obtaining the in-phase zero-IF signal and the quadrature zero- IF signal, and filtering the in-phase zero-IF signal and the quadrature zero-IF signal to obtain the fixed-band zero IF signal in the in-phase channel and the quadrature channel respectively. The method further comprises sampling the fixed-band zero IF signal in the in-phase channel and the quadrature channel, respectively. Thereafter, the method comprises applying a calibrated phase imbalance correction value to the sampled fixed-band zero-IF signal in the quadrature channel for correcting the phase imbalance in the receiver 200.

This embodiment of the method is aided by a tuner (comprising the mixers 204 and 210) of the receiver 200. It is observed that the phase imbalance in the tuner does not change with time due to self-matching of components of the tuner. However, the phase imbalance of the tuner changes with a change in pilot frequency. Further, the phase imbalance remains unchanged if a frequency of the tuner is constant. Therefore, a quick estimation of the phase imbalance may be carried out when a tuner is tuned to a particular frequency. The estimated value of the phase imbalance may be used until the tuner is tuned to another frequency.

Figure 4:
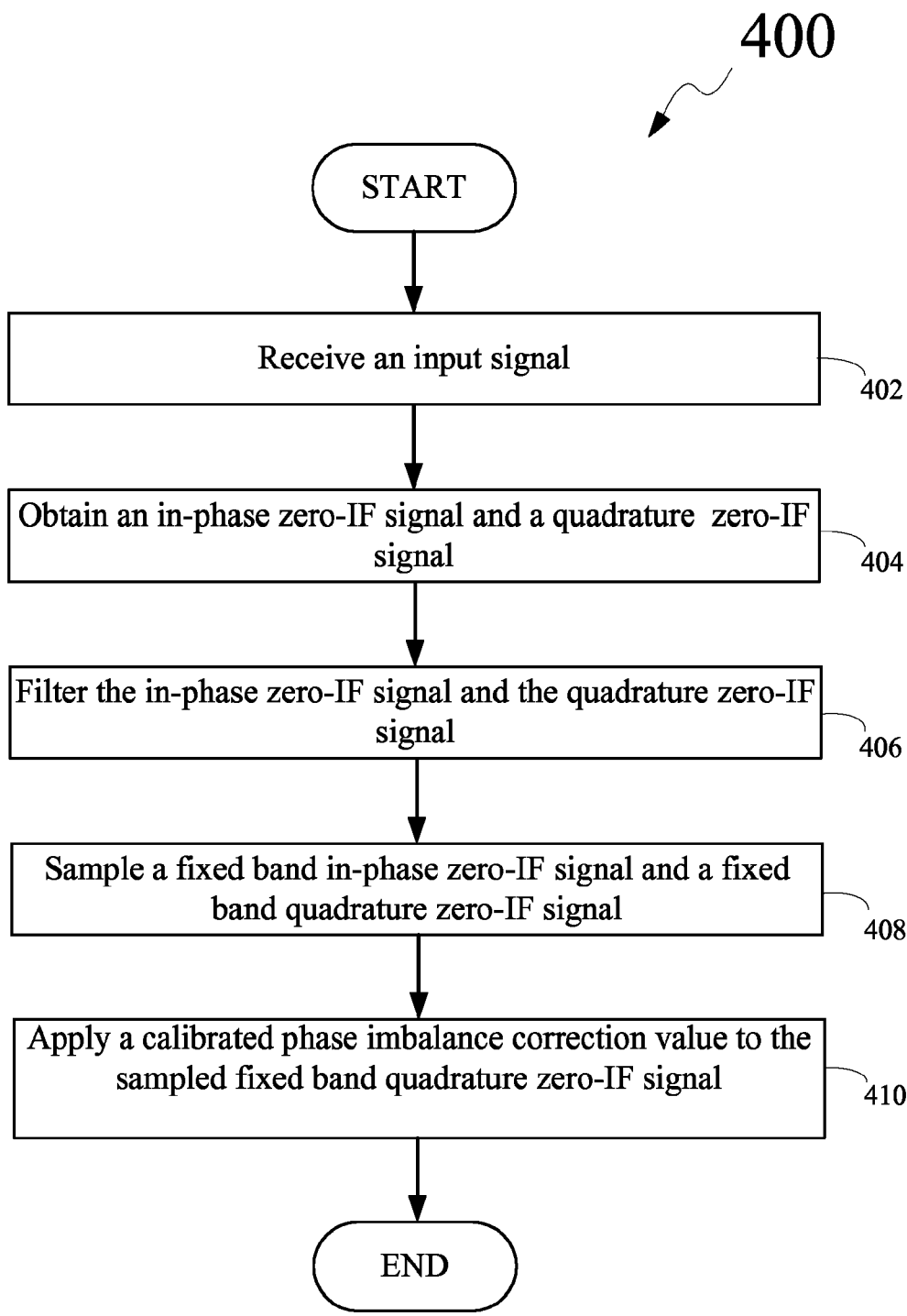
FIG. 4 is a flow diagram illustrating a method for correcting phase imbalance in the direct conversion receiver, according to another exemplary embodiment of the present disclosure Like reference numerals refer to like parts throughout the description of several views of the drawings.

FIG. 4 illustrates a flow diagram 400 of a method for correcting phase imbalance in the direct conversion receiver 200, according to another exemplary embodiment of the present disclosure. At 402, the method comprises receiving an input signal such as the input signal 220. The input signal is received at the mixers 204 and 210 of the in-phase channel 202*a* and quadrature channel 202*b*, respectively of the receiver 200. At 404, the method comprises obtaining an in-phase zero-IF signal, similar to signal 222, in the in-phase channel 202*a* and obtaining a quadrature zero-IF signal, similar to signal 228, in the quadrature channel 202*b*. At 406, the method comprises filtering the in-phase zero-IF signal and the quadrature zero-IF signal. As a result of filtering, a fixed band zero-IF signal is obtained in the in-phase channel 202*a* and a fixed band zero-IF signal is obtained in the quadrature channel 202*b*. Furthermore, at 408, the method comprises sampling the fixed band zero-IF signal in the in-phase channel 202*a* and the quadrature channel 202*b* to obtain a sampled fixed band zero-IF signal in each of the channels. Finally, at 410, the method comprises applying a calibrated phase imbalance correction value to the sampled fixed band zero-IF signal in the quadrature channel 202*b*.

In this embodiment of the present disclosure, the calibrated phase imbalance value is pre-determined by injecting tones in an RF domain as the input signal 220 to the receiver 200. More specifically, a tone in RF domain is provided as input signal 220 to the receiver 200 when the tuner is tuned to a particular frequency. The phase imbalance value for the tone is measured by using equation (7). A minimum of two tones is required to determine the calibrated phase imbalance correction value for the receiver 200. Further, the calibrated phase imbalance correction value is estimated by finding a gradient of the phase imbalance values for all the tones using a least square fit technique. The calibrated phase imbalance correction value is applied to the sampled signal in the quadrature channel 202*b* to correct the phase imbalance between the in-phase channel 202*a* and the quadrature channel 202*b*.

The aforesaid embodiment has an advantage of improving performance of the receiver 200 in a tracking phase, which is a critical phase in the performance of the receiver 200. Further, the aforesaid embodiment uses a calibrated value of the phase imbalance correction value, which is pre-determined for the receiver 200 by using the plurality of RF tones. Therefore, the embodiment has a small impact on an acquisition time of the receiver 200.

Various embodiments of the present disclosure offer following advantages. The present disclosure provides two methods of correcting the phase imbalance between the in-phase channel and quadrature channel of a direct conversion receiver. One of the methods is based on pilot carriers, which is applicable to an OFDM system. The other method involves use of tones in RF domain injected in a tuner of the direct conversion receiver, which may be applicable to any modulation scheme. Further, both the methods provide a simple estimation of the phase imbalance correction value for the direct conversion receiver, which may be used to correct the imbalance in the quadrature channel of the direct conversion receiver. Using the described methods the frequency dependent phase imbalance in the direct conversion receiver may be effectively corrected by introducing minimal hardware changes in the receiver. Also, the described methods estimate the phase imbalance correction value without affecting the acquisition time of the direct conversion receiver. Therefore, the present disclosure provides an effective solution to correct the frequency dependent phase imbalance in a direct-conversion receiver, such as the receiver 200.

The foregoing descriptions of specific embodiments of the present disclosure have been presented for purposes of illustration and description. They are not intended to be exhaustive or to limit the present disclosure to the precise forms disclosed, and obviously many modifications and variations are possible in light of the above teaching. The embodiments were chosen and described in order to best explain the principles of the present disclosure and its practical application, to thereby enable others skilled in the art to best utilize the present disclosure and various embodiments with various modifications as are suited to the particular use contemplated. It is understood that various omissions and substitutions of equivalents are contemplated as circumstance may suggest or render expedient, but such are intended to cover the application or implementation without departing from the spirit or scope of the claims of the present disclosure.

What is claimed is:

1. A method for correcting phase imbalance in a direct conversion receiver, the method comprising:
   receiving an input signal at an in-phase channel and at a quadrature channel of the direct-conversion receiver, wherein the input signal comprises a Radio frequency (RF) signal having a plurality of pilot carriers;
   obtaining an in-phase zero intermediate frequency (IF) signal in the in-phase channel and a quadrature zero-IF signal in the quadrature channel from the input signal;
   filtering the in-phase zero-IF signal and the quadrature zero-IF signal to obtain a fixed band zero-IF signal in the in-phase channel and a fixed band zero-IF signal in the quadrature channel respectively;
   sampling the fixed-band zero-IF signal in the in-phase channel and the fixed-band zero-IF signal in the quadrature channel;
   determining a phase imbalance correction value for the fixed band zero-IF signal in the quadrature channel, wherein the phase imbalance correction value is a function of the frequency of the fixed-band zero-IF signal in the in-phase channel and the fixed-band zero-IF signal in the quadrature channel, wherein determining the phase imbalance correction value comprises:
     extracting the plurality of pilot carriers from the in-phase zero-IF signal and the quadrature zero-IF signal;
     calculating a phase imbalance value for each pilot carrier of the plurality of pilot carriers by using the following equation:

$E(IQ)/E(I^2+Q^2)$ where:
E (IQ) is an average of a product of the fixed-band zero-IF signal in the in-phase channel and the fixed-band zero-IF signal in the quadrature channel, and E ($I^2+Q^2$) is an average value of a sum of a square of the fixed-band zero-IF signal in the in-phase channel and the fixed-band zero-IF signal in the quadrature channel; and determining the phase imbalance correction value from the phase imbalance value of each pilot carrier of the plurality of pilot carriers by determining the gradient with reference to frequency of the phase imbalance value using a least square fit;

applying the phase imbalance correction value to the sampled fixed-band zero-IF signal in the quadrature channel or to the sampled fixed-band zero-IF signal in the in-phase channel to correct the phase imbalance in the direct conversion receiver; and applying the phase imbalance correction value using an interpolation of the quadrature or in-phase components of the zero-IF signal.

2. A method for correcting phase imbalance in a direct conversion receiver, the method comprising:

receiving an input signal at an in-phase channel and at a quadrature channel of the direct conversion receiver;

obtaining an in-phase zero intermediate frequency (IF) signal in the in-phase channel and a quadrature zero-IF signal in the quadrature channel from the input signal;

filtering the in-phase zero-IF signal and the quadrature zero-IF signal to obtain a fixed band zero-IF signal in the in-phase channel and a fixed band zero-IF signal in the quadrature channel respectively;

sampling the fixed-band zero-IF signal in the in-phase channel and the fixed-band zero-IF signal in the quadrature channel; and applying a calibrated phase imbalance correction value to the sampled fixed-band zero-IF signal in the quadrature channel to correct the phase imbalance in the direct conversion receiver;

wherein prior to applying the calibrated phase imbalance correction value, the method comprises:

receiving a plurality of RF tones at the in-phase channel and at the quadrature channel of the direct-conversion receiver;

obtaining an in-phase zero intermediate frequency (IF) signal in the in-phase channel and a quadrature zero-IF signal in the quadrature channel from each RF tone of the plurality of RF tones;

filtering the in-phase zero-IF signal and the quadrature zero-IF signal for the each RF tone of the plurality of RF tones to obtain a fixed band zero-IF signal in the in-phase channel and a fixed band zero-IF signal in the quadrature channel respectively for the each RF tone of the plurality of RF tones; and determining the calibrated phase imbalance correction value for the fixed band zero-IF signal in the quadrature channel, wherein the phase imbalance correction value is a function of the fixed-band zero-IF signal in the in-phase channel and the fixed-band zero-IF signal in the quadrature channel for the each RF tone of the plurality of RF tones, wherein determining the calibrated phase imbalance correction value comprises:

extracting the plurality of RF tones from the in-phase zero-IF signal and the quadrature zero-IF signal;

calculating a phase imbalance value for the each RF tone of the plurality of RF tones by using the following equation:

$E(IQ)/E(I^2+Q^2)$ where:
E (IQ) is an average of a product of the fixed-band zero-IF signal in the in-phase channel and the fixed-band zero-IF signal in the quadrature channel, and E ($I^2+Q^2$) is an average value of a sum of a square of the fixed-band zero-IF signal in the in-phase channel and the fixed-band zero-IF signal in the quadrature channel; and determining the phase imbalance correction value from the phase imbalance value for the each RF tone of the plurality of RF tones by determining the gradient with reference to frequency of the phase imbalance value using a least square fit.

* * * * *